(12) United States Patent
Yeo (10) Patent No.: US 11,848,568 B2
(45) Date of Patent: Dec. 19, 2023

(54) METHOD AND APPARATUS FOR DETERMINING MUTUAL INDUCTANCE FOR EFFECTIVE WIRELESS POWER TRANSMISSION

(71) Applicant: ETA ELECTRONICS CO., LTD., Gyeongsan-si (KR)

(72) Inventor: Taedong Yeo, Seoul (KR)

(73) Assignee: ETA ELECTRONICS CO., LTD., Gyeongsan-si (KR)

(*) Notice: Subject to any disclaimer, the term of this patent is extended or adjusted under 35 U.S.C. 154(b) by 182 days.

(21) Appl. No.: 17/627,681

(22) PCT Filed: Jul. 29, 2020

(86) PCT No.: PCT/KR2020/009985
§ 371 (c)(1),
(2) Date: Jan. 16, 2022

(87) PCT Pub. No.: WO2021/020875
PCT Pub. Date: Feb. 4, 2021

(65) Prior Publication Data
US 2022/0247222 A1 Aug. 4, 2022

(30) Foreign Application Priority Data
Jul. 31, 2019 (KR) .......... 10-2019-0092894

(51) Int. Cl.
*H02J 50/12* (2016.01)
*H02J 50/80* (2016.01)
*H01F 38/14* (2006.01)

(52) U.S. Cl.
CPC ............. *H02J 50/12* (2016.02); *H01F 38/14* (2013.01); *H02J 50/80* (2016.02)

(58) Field of Classification Search
CPC .......... H02J 50/12; H02J 50/80; H02J 50/402; H01F 38/14; G01R 27/2611; H03H 7/38
(Continued)

(56) References Cited

U.S. PATENT DOCUMENTS

2015/0236526 A1* 8/2015 Jadidian ............... H02J 50/402
 320/108
2018/0130599 A1 5/2018 Yun et al.
2019/0379232 A1* 12/2019 Lemdiasov .......... H04B 5/0081

FOREIGN PATENT DOCUMENTS

GB 2556124 A 5/2018
KR 10-2012-0020452 A 3/2012
(Continued)

OTHER PUBLICATIONS

International Search Report in International Application No. PCT/KR2020/009985, dated Nov. 19, 2020, 3 pages.

*Primary Examiner* — Richard Tan
(74) *Attorney, Agent, or Firm* — Park, Kim & Suh, LLC (57) ABSTRACT

Disclosed is a method and apparatus for determining mutual inductance for effective wireless power transmission. The apparatus includes a resonance circuit unit including at least one transmission resonance circuit and at least one reception resonance circuit and configured to transmit power to the reception resonance circuit using power supplied to the transmission resonance circuit, and a controller configured to determine a mutual inductance value related to a transmission resonance circuit to which power is supplied when power is supplied only to any one transmission resonance circuit of the at least one transmission resonance circuit and power supply to another transmission resonance circuit is blocked, and to determine a sign of mutual inductance related to a transmission resonance circuit to which power is supplied when power is supplied only to a reference transmission resonance circuit and any one transmission reso- (Continued)

nance circuit except for the reference transmission resonance circuit.

6 Claims, 6 Drawing Sheets

(58) Field of Classification Search
USPC .......................................................... 307/104
See application file for complete search history.

(56) References Cited

FOREIGN PATENT DOCUMENTS

| | | |
|---|---|---|
| KR | 10-2013-0124109 A | 11/2013 |
| KR | 10-2015-0017807 A | 2/2015 |
| KR | 10-2016-0122806 A | 10/2016 |
| KR | 10-2017-0120585 A | 10/2017 |
| WO | 2012/046453 A1 | 4/2012 |

* cited by examiner

METHOD AND APPARATUS FOR DETERMINING MUTUAL INDUCTANCE FOR EFFECTIVE WIRELESS POWER TRANSMISSION

CROSS-REFERENCE TO RELATED APPLICATIONS

This application is a National Phase Application of PCT International Application No. PCT/KR2020/009985, which was filed on Jul. 29, 2020, and which claims priority from Korean Patent Application No. 10-2019-0092894 filed on Jul. 31, 2019. The disclosures of the above patent applications are incorporated herein by reference in their entirety.

TECHNICAL FIELD

The present disclosure relates to a method and apparatus for determining mutual inductance for effective wireless power transmission, and more particularly to a method and apparatus for determining a mutual inductance value for obtaining the maximum efficiency for effective wireless power transmission.

BACKGROUND ART

Wireless power transmission refers to supplying power to an electronic device wirelessly instead of wired and enables a device that requires power to be charged wirelessly without connecting to a power outlet, and accordingly related research has been actively conducted. As for wireless power transmission technology, a magnetic induction method, a magnetic resonance method, a microwave method, etc. have been studied.

A wireless power transmission device includes a power transmitter for wirelessly transmitting power and a power receiver for wirelessly receiving power, the power transmitter and the power receiver use coils, and in this regard, when the power transmitter and the power receiver have the same resonant frequency, the maximum power transmission may occur in the wireless power transmission device.

The coils included in the power transmitter and the power receiver may have mutual inductance as well as self-inductance. Since mutual inductance largely affects power transmission, it is important to determine an optimal inductance value to obtain the maximum wireless transmission efficiency. However, the wireless power transmission device includes various circuit elements, and thus it is not easy to determine the mutual inductance value depending on the state of the wireless power transmission device.

DISCLOSURE

Technical Problem

The present disclosure relates to a method and apparatus for determining mutual inductance for effective wireless power transmission.

The present disclosure relates to a method and apparatus for determining mutual inductance for acquiring the maximum efficiency of wireless power transmission.

Technical Solution

In accordance with one aspect of the present disclosure, provided is a wireless power transmission device including a resonance circuit unit including at least one transmission resonance circuit and at least one reception resonance circuit and configured to transmit power supplied to the transmission resonance circuit to the reception resonance circuit, and a controller configured to determine a mutual inductance value related to a transmission resonance circuit to which power is supplied when power is supplied only to any one transmission resonance circuit of the at least one transmission resonance circuit and power supply to another transmission resonance circuit is blocked, and to determine a sign of mutual inductance related to a transmission resonance circuit to which power is supplied when power is supplied only to a reference transmission resonance circuit and any one transmission resonance circuit except for the reference transmission resonance ci.

The controller may determine the mutual inductance value using Equation 1.

$$M_{tq} = \frac{|V_{Rq}|(Z_{Sq} + R_{Lg})}{I_{Pt}\omega R_{Lq}} \quad \text{[Equation 1]}$$

in this case, $M_{tq}$: mutual inductance of $t^{th}$ transmission resonance circuit and $q^{th}$ reception resonance circuit $I_{Pt}$: input current of $t^{th}$ transmission resonance circuit w: operating angular frequency $R_{Lq}$: load resistance of $q^{th}$ reception resonance circuit $V_{Rq}$: rectified received voltage of $q^{th}$ reception resonance circuit $Z_{Sq}$: impedance of $q^{th}$ reception resonance circuit $$Z_{Sq} = \frac{1}{j\omega C_{Sq}} + j\omega L_{Sq} + R_{Sq}$$

$C_{Sq}$: capacitance of $q^{th}$ reception resonance circuit $L_{Sq}$: self-inductance of $q^{th}$ reception resonance circuit $R_{Sq}$: internal resistance of $q^{th}$ reception resonance circuit After supplying currents having equal magnitude and in-phase and currents having equal magnitude and out of phase to the reference transmission resonance circuit and any one transmission resonance circuit except for the reference transmission resonance circuit, the controller may compare receives voltages of the respective reception resonance circuits to determine a sign of mutual inductance.

The controller may determine the sign of the mutual inductance using Equation 2.

if) in the case of $V_{Rq,in\text{-}phase} > V_{Rq,out\ of\ phase}(+)$ if) in the case of $V_{Rq,in\text{-}phase} < V_{Rq,out\ of\ phase}(-)$     [Equation]

in this case, $V_{Rq,in\text{-}phase}$ is a voltage generated in a $q^{th}$ reception resonance circuit when currents having predetermined equal magnitude and in-phase are supplied to the reference transmission resonance circuit and the transmission resonance circuit for determining a sign, and $V_{Rq,out\ of\ phase}$ is a voltage generated in a $q^{th}$ reception resonance circuit when currents having predetermined equal magnitude and out of phase are supplied to the reference transmission resonance circuit and the transmission resonance circuit for determining a sign.

In accordance with another aspect of the present disclosure, provided is a method of determining mutual inductance for wireless power transmission, the method including supplying power only to any one transmission resonance circuit and blocking power supply to another transmission resonance circuit by a resonance circuit unit including at least one transmission resonance circuit and at least one reception resonance circuit, determining a mutual inductance value related to a transmission resonance circuit to which power is supplied, determining a reference transmission resonance circuit of the at least one transmission resonance circuit and determining a sign of the reference transmission resonance circuit, and determining a sign of mutual inductance related to a transmission resonance circuit to which power is supplied when power is supplied only to the reference transmission resonance circuit and any one transmission resonance circuit except for the reference transmission resonance circuit.

The determining the mutual inductance value may include determining the mutual inductance value using Equation 1.

$$M_{tq} = \frac{|V_{Rq}|(Z_{Sq} + R_{Lg})}{I_{Pt}\omega R_{Lq}} \quad \text{[Equation 1]}$$

in this case, $M_{tq}$: mutual inductance of $t^{th}$ transmission resonance circuit and $q^{th}$ reception resonance circuit $I_{Pt}$: input current of $t^{th}$ transmission resonance circuit w: operating angular frequency $R_{Lq}$: load resistance of $q^{th}$ reception resonance circuit $V_{Rq}$: rectified received voltage of $q^{th}$ reception resonance circuit $Z_{Sq}$: impedance of $q^{th}$ reception resonance circuit $$Z_{Sq} = \frac{1}{j\omega C_{Sq}} + j\omega L_{Sq} + R_{Sq}$$

$C_{Sq}$: capacitance of $q^{th}$ reception resonance circuit $L_{Sq}$: self-inductance of $q^{th}$ reception resonance circuit $R_{Sq}$: internal resistance of $q^{th}$ reception resonance circuit The determining the sign may include supplying currents having equal magnitude and in-phase to the reference transmission resonance circuit and any one transmission resonance circuit except for the reference transmission resonance circuit and determining a first received voltage of each reception resonance circuit, supplying currents having equal magnitude and out of phase to the reference transmission resonance circuit and any one transmission resonance circuit except for the reference transmission resonance circuit and determining a second received voltage of each reception resonance circuit, and comparing the first received voltage and the second received voltage and determining a sign of mutual inductance.

The determining the sign of the mutual inductance may include determining the sign of the mutual inductance using Equation 2.

if) in the case of $V_{Rq,in\text{-}phase} > V_{Rq,out\ of\ phase}(+)$ if) in the case of $V_{Rq,in\text{-}phase} < V_{Rq,out\ of\ phase}(-)$ [Equation]

in this case, $V_{Rq,in\text{-}phase}$ is a voltage generated in a $q^{th}$ reception resonance circuit when currents having predetermined equal magnitude and in-phase are supplied to the reference transmission resonance circuit and the transmission resonance circuit for determining a sign, and $V_{Rq,out\ of\ phase}$ is a voltage generated in a $q^{th}$ reception resonance circuit when currents having predetermined equal magnitude and out of phase are supplied to the reference transmission resonance circuit and the transmission resonance circuit for determining a sign.

Advantageous Effects

According to the present disclosure, mutual inductance for effective wireless power transmission may be rapidly and accurately determined to effectively provide wireless power transmission with the maximum efficiency.

BEST MODE

Hereinafter, the present disclosure will be described in detail by explaining exemplary embodiments of the present disclosure with reference to the accompanying drawings. In the following description of the present disclosure, a detailed description of known functions and configurations incorporated herein will be omitted when it may make the subject matter of the present disclosure unclear.

Figure 1:
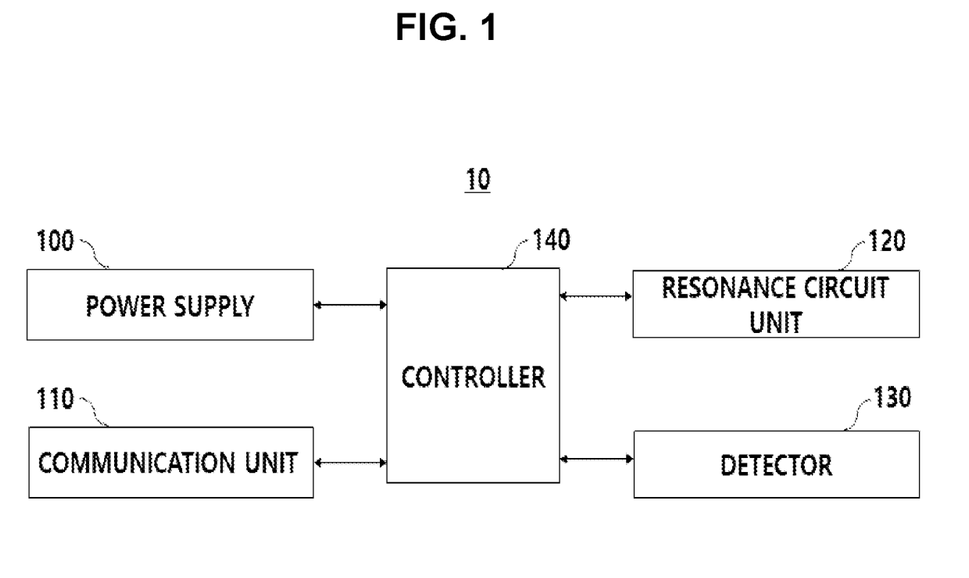
FIG. 1 is a diagram showing a configuration of a wireless power transmission device according to an embodiment of the present disclosure.

FIG. 1 is a diagram showing a configuration of a wireless power transmission device 10 according to an embodiment of the present disclosure.

Referring to FIG. 1, the wireless power transmission device 10 according to the present disclosure may include a power supply 100, a resonance circuit 120, a detector 130, and a controller 140, and may further include a communication unit 110.

The power supply 100 may supply power to the wireless power transmission device 10 according to the present disclosure, and for example, may supply alternating current (AC) power.

The detector 130 may detect voltage, current, or the like at a predetermined position of the wireless power transmission device 10 according to the present disclosure and may include various sensors.

The resonance circuit unit 120 may transmit power according to a resonance phenomenon between coils and may include at least one transmission resonance circuit and at least one reception resonance circuit that include a capacitor and an inductor.

The communication unit 110 may be used for communication with an external device or communication inside the wireless power transmission device 10 according to the present disclosure and may include a communication device that accesses a mobile communication network to perform communication according to short-distance communication such as Bluetooth or WiFi or various mobile communication standards such as LTE or $5^{th}$ generation (5G).

The controller 140 may control the wireless power transmission device 10 according to the present disclosure as a whole, and for example, may determine a mutual inductance value of the resonance circuit unit 120 for the maximum wireless power transmission.

Figure 2:
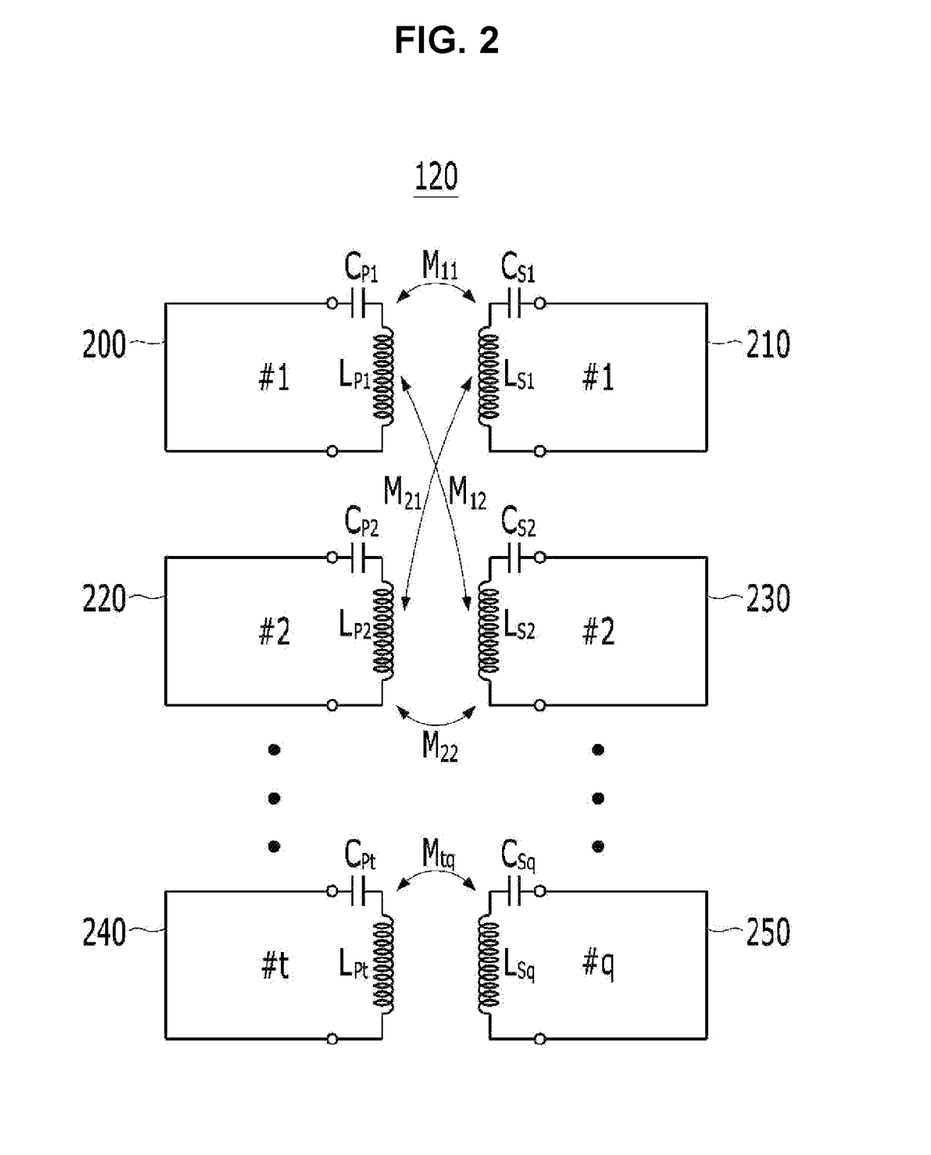
FIG. 2 is a diagram for explaining a resonance circuit unit of a wireless power transmission device according to an embodiment of the present disclosure.

FIG. 2 is a diagram for explaining the resonance circuit unit 120 of the wireless power transmission device 10 according to an embodiment of the present disclosure.

Referring to FIG. 2, the resonance circuit unit 120 of the wireless power transmission device 10 according to the present disclosure may include first to $t^{th}$ transmission resonance circuits 200, 220, and 240, and first to $q^{th}$ reception resonance circuits 210, 230, and 250. The first to $t^{th}$ transmission resonance circuits 200, 220, and 240 may include self-inductances $4_1$, $4_2$, and $L_{pt}$ and capacitances $C_{pi}$, $C_{r2}$, and $C_{pt}$, and the first to $q^{th}$ reception resonance circuits 210, 230, and 250 may include self-inductances $L_{S1}$, $L_{S2}$, and $L_{Sq}$ and capacitances $C_{S1}$, $C_{S2}$, and $C_{Sq}$. The first to $t^{th}$ transmission resonance circuits 200, 220, and 240 and the first to $q^{th}$ reception resonance circuits 210, 230, and 250 may include mutual inductances $M_{11}$, $M_{12}$, $M_{21}$, $M_{22}$, and $M_{tq}$. The first to $t^{th}$ transmission resonance circuits 200, 220, and 240 may transmit power generated using power supplied from the power supply 100 to the first to $q^{th}$ reception resonance circuits 210, 230, and 250 and may transmit the maximum power at a resonant frequency $f_0$.

Figure 3:
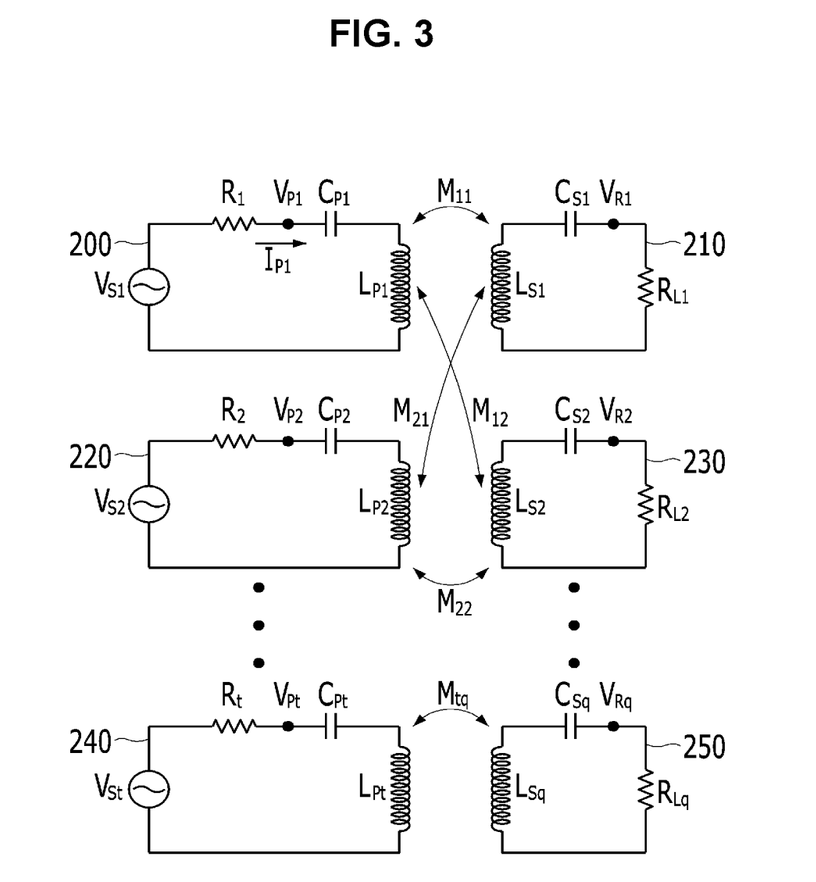
FIG. 3 is a diagram showing an equivalent circuit of a wireless power transmission device according to an embodiment of the present disclosure.

FIG. 3 is a diagram showing an equivalent circuit of the wireless power transmission device 10 according to an embodiment of the present disclosure.

The equivalent circuit illustrated in FIG. 3 is for explaining a method of determining a mutual inductance value for effective wireless power transmission, and related content of the detector 130, the communication unit 110, and the controller 140 is not shown.

Referring to FIG. 3, the equivalent circuit of the wireless power transmission device 10 according to the present disclosure may include first to $t^{th}$ power supplies $V_{S1}$, $V_{S2}$, $V_{St}$ for supplying power to the first to $t^{th}$ transmission resonance circuits 200, 220, and 240, the resonance circuit unit 120, and load resistances $R_{L1}$, $R_{L2}$, and $R_{Lq}$ disposed at the first to $q^{th}$ reception resonance circuits 210, 230, and 250.

When configured as in FIG. 3, if the first to $t^{th}$ power supplies $V_{S1}$, $V_{S2}$, and $V_{St}$ supply power to the first to $t^{th}$ transmission resonance circuits 200, 220, and 240, input voltages $V_{P1}$, $V_{P2}$, and $V_{Pt}$ may be generated in the first to $t^{th}$ transmission resonance circuits 200, 220, and 240, and reception voltages $V_{R1}$, $V_{R2}$, and $V_{Rq}$ may be generated in the first to $q^{th}$ reception resonance circuits 210, 230, and 250.

In this case, a mutual inductance value for effectively transmitting power to the first to $q^{th}$ reception resonance circuits 210, 230, and 250 from the first to $t^{th}$ transmission resonance circuits 200, 220, and 240 may be determined using Equation 1 below.

$$M_{tq} = \frac{|V_{Rq}|(Z_{Sq} + R_{Lg})}{I_{Pt}\omega R_{Lq}} \quad [\text{Equation 1}]$$

In this case, $M_{tq}$: mutual inductance of $t^{th}$ transmission resonance circuit and $q^{th}$ reception resonance circuit
$I_{Pt}$: input current of $t^{th}$ transmission resonance circuit
w: operating angular frequency
$R_{Lq}$: load resistance of $q^{th}$ reception resonance circuit $V_{Rq}$: rectified received voltage of $q^{th}$ reception resonance circuit
$Z_{Sq}$: impedance of $q^{th}$ reception resonance circuit $$Z_{Sq} = \frac{1}{j\omega C_{Sq}} + j\omega L_{Sq} + R_{Sq}$$

$C_{Sq}$: capacitance of $q^{th}$ reception resonance circuit
$L_{Sq}$: self-inductance of $q^{th}$ reception resonance circuit
$R_{Sq}$: internal resistance of $q^{th}$ reception resonance circuit According to the present disclosure, to determine a mutual inductance value, a mutual inductance value may be determined using Equation 1 above in the state in which power is supplied to any one transmission resonance circuit only and power supply to another resonance circuit is blocked.

For example, current $I_{P1}$ may be supplied only to the first transmission resonance circuit 200 and power supply to the second to $t^{th}$ transmission resonance circuits 220 and 240 may be blocked, and then mutual inductances $M_{11}$, and $M_{12}$ to $M_{1q}$ related to the first transmission resonance circuit 200 may be determined. Then, current $I_{P2}$ may be supplied only to the second transmission resonance circuit 220 and power supply to the first transmission resonance circuit 200 and the third transmission resonance circuit (not shown) to the $t^{th}$ resonance circuit 240 may be blocked, and then mutual inductances $M_{21}$, and $M_{22}$ to $M_{2q}$ related to the second transmission resonance circuit 220 may be determined. When the same method proceeds to the $t^{th}$ transmission resonance circuit 240, all mutual inductance values may be determined.

When a mutual inductance value is determined, a sign of the mutual inductance may be determined, and in this case, the sign of the mutual inductance may be determined using Equation 2 below.

if) in the case of $V_{Rq,in\text{-}phase} > V_{Rq,out\ of\ phase}(+)$ if) in the case of $V_{Rq,in\text{-}phase} < V_{Rq,out\ of\ phase}(-)$ [96][Equation 2]

In this case, $V_{Rq,in\text{-}phase}$ is a voltage generated in a $q^{th}$ reception resonance circuit when currents having predetermined equal magnitude and in-phase are supplied to the reference transmission resonance circuit and the transmission resonance circuit for determining a sign.

$V_{Rq,out\ of\ phase}$ is a voltage generated in a $q^{th}$ reception resonance circuit when currents having predetermined equal magnitude and out of phase are supplied to the reference transmission resonance circuit and the transmission resonance circuit for determining a sign.

In this case, power supply to another transmission resonance circuit except for the reference transmission resonance circuit and the transmission resonance circuit for determining a sign may be blocked.

When a sign of the mutual inductance is (+), this indicates in-phase, and when the sign of the mutual inductance is (−), this indicates out of phase. In addition, the reference transmission resonance circuit may be arbitrarily determined, and all signs of the mutual inductance related to the reference transmission resonance circuit may be (+).

For example, when the first transmission resonance circuit 200 is determined as the reference transmission resonance circuit, all signs of the mutual inductances $M_{11}$ to $M_{1q}$ related to the first transmission resonance circuit 200 may be (+).

To determine a sign of the mutual inductances $M_{21}$ to $M_{2q}$ related to the second transmission resonance circuit 220, currents having predetermined equal magnitude and in-phase may be supplied to the first transmission resonance circuit 200 as a reference and the second transmission resonance circuit 220 for determining a sign to measure received voltages of the first reception resonance circuit to $q^{th}$ reception resonance circuits 210 and 250. Then, currents having predetermined equal magnitude and out of phase are supplied to the first transmission resonance circuit 200 and the second transmission resonance circuit 220 to measure received voltages of the first reception resonance circuit to $q^{th}$ reception resonance circuits 210 and 250. When the received voltages of the first reception resonance circuit to $q^{th}$ reception resonance circuits 210 and 250 are measured, a sign of mutual inductance may be determined using Equation 2 above.

With respect to the third transmission resonance circuit (not shown) to the $t^{th}$ transmission resonance circuit 240, a sign of mutual inductance may be determined using the aforementioned method. For example, currents having equal magnitude and in-phase are supplied to the first transmission resonance circuit 200 as a reference and the $t^{th}$ transmission resonance circuit 240, and currents having equal magnitude and out of phase are also supplied thereto to measure received voltages of the first reception resonance circuit to $q^{th}$ reception resonance circuits 210 and 250, respectively, and then a sign of mutual inductance may be determined using Equation 2 above.

Figure 4:
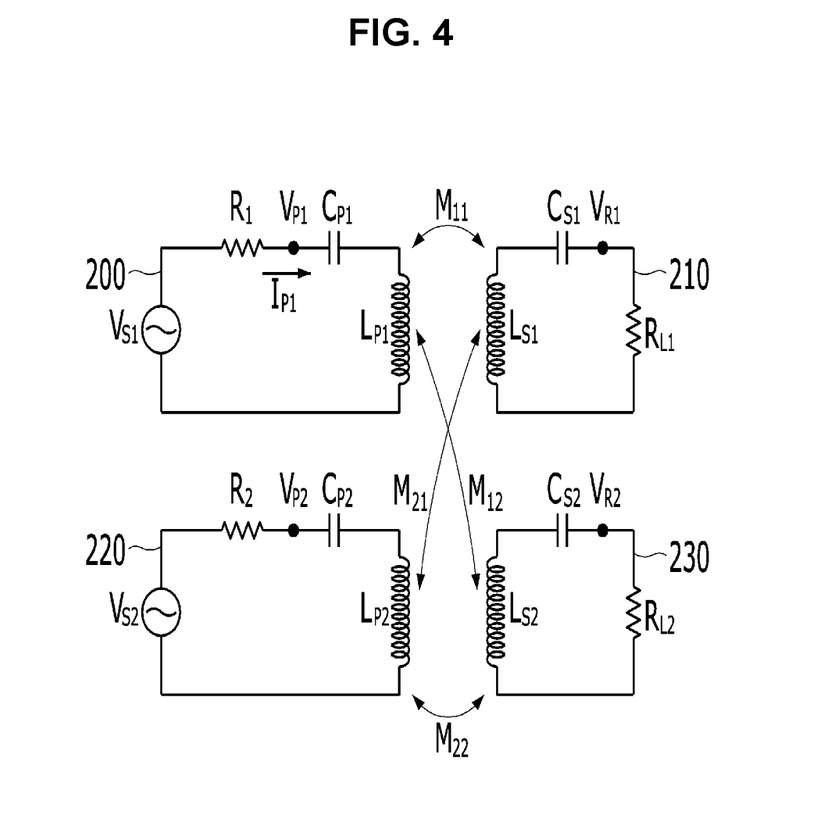
FIGS. 4 and 5 are diagrams showing experimental examples of a method of determining a mutual inductance value of a wireless power transmission device according to an embodiment of the present disclosure.
Figure 5:
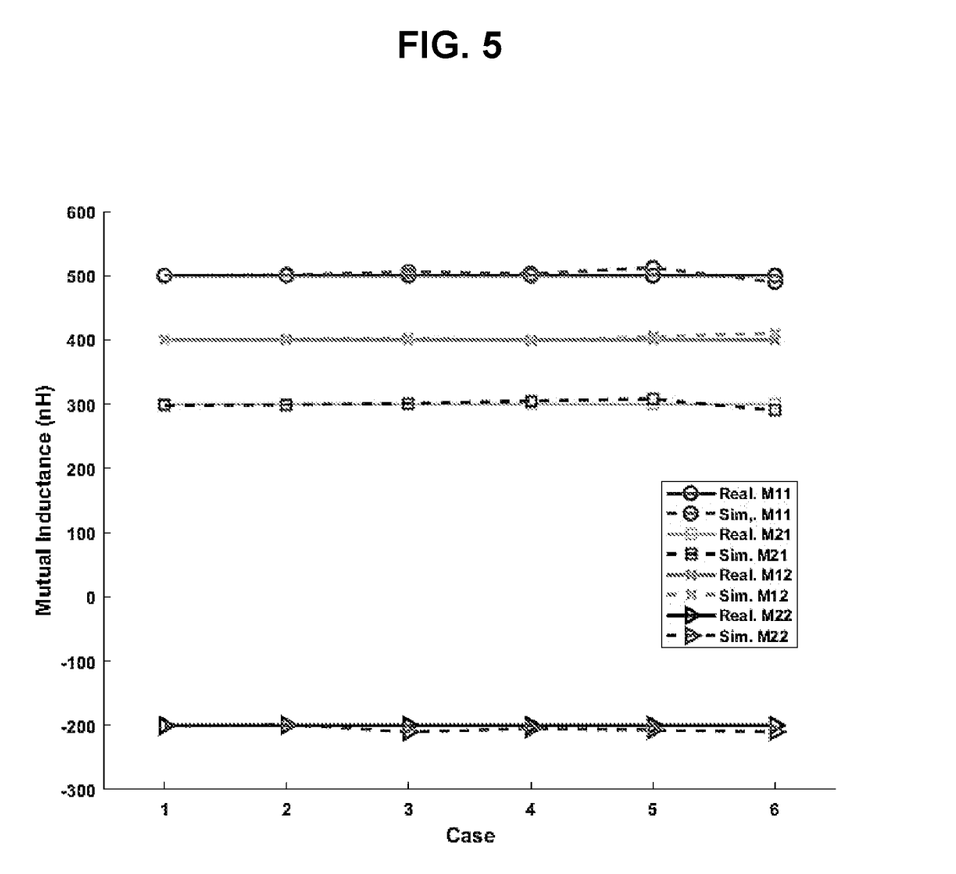

FIGS. 4 and 5 are diagrams showing experimental examples of a method of determining a mutual inductance value of the wireless power transmission device 10 according to an embodiment of the present disclosure.

FIG. 4 shows the case in which two transmission resonance circuits and two reception resonance circuits are used, and experiments are performed on various cases of Case 1 to Case 6 to apply the aforementioned content.

A simulation environment of the wireless power transmission device 10 is set to power (AC) 8V, f=6.78 MHz, $C_{P1}=C_{P2}=322$ pF, $C_{S1}=C_{S2}=330$ pF, and $L_{S1}=L_{S2}=1.708$ U h.

Case 1 to Case 6 may have the following condition.
Case 1: $f=f_0$, $R_{L1}=R_{L2}=10$ Ohm
Case 2: $f=f_0$, $R_{L1}=10$ Ohm, $R_{L2}=100$ Ohm
Case 3: $f \neq f_0$, $\Delta f_{Tx}=35$ kHz, $R_{L1}=R_{L2}=10$ Ohm
Case 4: $f \neq f_0$, $\Delta f_{Tx}=35$ kHz, $R_{L1}=10$ Ohm, $R_{L2}=100$ Ohm
Case 5: $f \neq f_0$, $\Delta f_{Tx}=35$ kHz, $\Delta f_{Rx}=25$ kHz, $R_{L1}=R_{L2}=10$ Ohm
Case 6: $f \neq f_0$, $\Delta f_{Tx}=35$ kHz, $\Delta f_{Rx}=25$ kHz, $R_{L1}=10$ Ohm, $R_{L2}=100$ Ohm In this case, $\Delta f_{Tx}=f-f_{o,Tx}$ that is a difference between an operating frequency and a resonance frequency in a transmission resonance circuit $\Delta f_{Rx}=f-f_{o,Rx}$ that is a difference between an operating frequency and a resonance frequency in a reception resonance circuit A simulation result of mutual inductance calculated by setting real mutual inductance to $M_{11}=500$ nH, $M_{12}=400$ nH, $M_{21}=300$ nH, and $M_{22}=(-)200$ nH and applying Equations 1 and 2 above is shown in FIG. 5.

In FIG. 5, Real indicates real mutual inductance, and Sim indicates mutual inductance calculated by applying Equations 1 and 2 above. As seen from FIG. 5, the real mutual inductance and the mutual inductance calculated by applying Equations 1 and 2 above are quite consistent.

Figure 6:
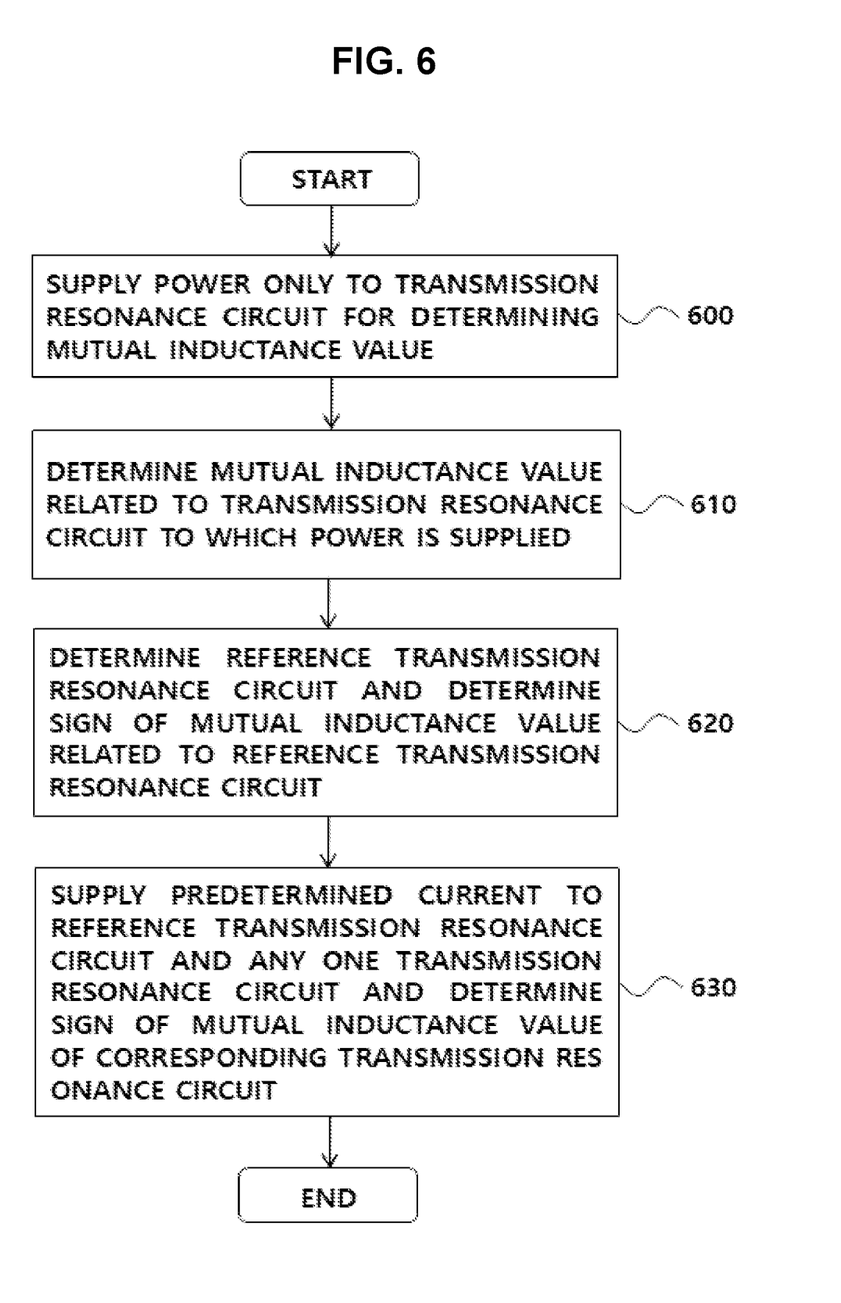
FIG. 6 is a flowchart for explaining a method of determining a mutual inductance value of a wireless power transmission device according to an embodiment of the present disclosure.

FIG. 6 is a flowchart for explaining a method of determining a mutual inductance value of the wireless power transmission device 10 according to an embodiment of the present disclosure.

Referring to FIG. 6, power may be supplied only to a transmission resonance circuit for determining a mutual inductance value, and power supply to another transmission resonance circuit may be blocked (600). When power is supplied, a mutual inductance value related to the transmission resonance circuit to which power is supplied may be determined using Equation 1 above (610). When all mutual inductance values are determined, the reference transmission resonance circuit may be determined to determine a sign of mutual inductance related to the reference transmission resonance circuit may be determined (620). Then, predetermined current may be supplied only to a reference transmission circuit and any one transmission resonance circuit and a sign of mutual inductance related to the transmission resonance circuit to which current is supplied may be determined using Equation 2 above (630). In this case, currents having equal magnitude and in-phase and currents having equal magnitude and out of phase may be supplied.

Although specific embodiments have been described in the detailed description of the present disclosure, various modifications are possible without departing from the scope of the present disclosure.

Therefore, the scope of the present disclosure is not limited to the described embodiments, and should be determined not only by the scope of the claims to be described below, but also by the scope and equivalents of the claims.

The invention claimed is:

1. A wireless power transmission device comprising:
a resonance circuit unit including at least one transmission resonance circuit and at least one reception resonance circuit and configured to transmit power to the reception resonance circuit using power supplied to the transmission resonance circuit; and
a controller configured to determine a mutual inductance value related to a transmission resonance circuit to which power is supplied when power is supplied only to any one transmission resonance circuit of the at least one transmission resonance circuit and power supply to another transmission resonance circuit is blocked, and to determine a sign of mutual inductance related to a transmission resonance circuit to which power is supplied when power is supplied only to a reference transmission resonance circuit and any one transmission resonance circuit except for the reference transmission resonance circuit,
wherein after supplying currents having equal magnitude and in-phase and currents having equal magnitude and out of phase to the reference transmission resonance circuit and any one transmission resonance circuit except for the reference transmission resonance circuit, the controller compares received voltages of the respective reception resonance circuits to determine the sign of the mutual inductance.

2. The wireless power transmission device of claim 1, wherein the controller determines the mutual inductance value using Equation 1:

$$M_{tq} = \frac{|V_{Rq}|(Z_{Sq} + R_{Lg})}{I_{Pt} \omega R_{Lq}} \quad \text{[Equation 1]}$$

wherein $M_{tq}$: mutual inductance of $t^{th}$ transmission resonance circuit and $q^{th}$ reception resonance circuit
$I_{Pt}$: input current of $t^{th}$ transmission resonance circuit
w: operating angular frequency $R_{Lq}$: load resistance of $q^{th}$ reception resonance circuit
$V_{Rq}$: rectified received voltage of $q^{th}$ reception resonance circuit
$Z_{Sq}$: impedance of $q^{th}$ reception resonance circuit $$Z_{Sq} = \frac{1}{j\omega C_{Sq}} + j\omega L_{Sq} + R_{Sq}$$

$C_{Sq}$: capacitance of $q^{th}$ reception resonance circuit
$L_{Sq}$: self-inductance of $q^{th}$ reception resonance circuit
$R_{Sq}$: internal resistance of $q^{th}$ reception resonance circuit.

3. The wireless power transmission device of claim 1, wherein the controller determines the sign of the mutual inductance using Equation 2:

in the case of $V_{Rq,in\text{-}phase} > V_{Rq,out\ of\ phase}(+)$ in the case of $V_{Rq,in\text{-}phase} < V_{Rq,out\ of\ phase}(-)$  [Equation 2]

wherein $V_{Rq,in\text{-}phase}$ is a voltage generated in a $q^{th}$ reception resonance circuit when currents having predetermined equal magnitude and in-phase are supplied to the reference transmission resonance circuit and the transmission resonance circuit for determining the sign of the mutual inductance, and $V_{Rq,out\ of\ phase}$ is a voltage generated in a $q^{th}$ reception resonance circuit when currents having predetermined equal magnitude and out of phase are supplied to the reference transmission resonance circuit and the transmission resonance circuit for determining the sign of the mutual inductance.

4. A method of determining mutual inductance for wireless power transmission, the method comprising:
supplying power only to any one transmission resonance circuit and blocking power supply to another transmission resonance circuit by a resonance circuit unit including at least one transmission resonance circuit and at least one reception resonance circuit;
determining a mutual inductance value related to a transmission resonance circuit to which power is supplied;
determining a reference transmission resonance circuit of the at least one transmission resonance circuit and determining a sign of the reference transmission resonance circuit; and
determining a sign of mutual inductance related to a transmission resonance circuit to which power is supplied when power is supplied only to the reference transmission resonance circuit and any one transmission resonance circuit except for the reference transmission resonance circuit,
wherein the determining the sign of the mutual inductance includes:
supplying currents having equal magnitude and in-phase to the reference transmission resonance circuit and any one transmission resonance circuit except for the reference transmission resonance circuit and determining a first received voltage of each reception resonance circuit;
supplying currents having equal magnitude and out of phase to the reference transmission resonance circuit and any one transmission resonance circuit except for the reference transmission resonance circuit and determining a second received voltage of each reception resonance circuit; and
comparing the first received voltage and the second received voltage and determining the sign of the mutual inductance.

5. The method of claim 4, wherein the determining the mutual inductance value includes determining the mutual inductance value using Equation 1:

$$M_{tq} = \frac{|V_{Rq}|(Z_{Sq} + R_{Lg})}{I_{Pt}\omega R_{Lq}} \quad \text{[Equation 1]}$$

wherein $M_{tq}$: mutual inductance of $t^{th}$ transmission resonance circuit and $q^{th}$ reception resonance circuit
$I_{Pt}$: input current of $t^{th}$ transmission resonance circuit
w: operating angular frequency
$R_{Lq}$: load resistance of $q^{th}$ reception resonance circuit
$V_{Rq}$: rectified received voltage of $q^{th}$ reception resonance circuit
$Z_{Sq}$: impedance of $q^{th}$ reception resonance circuit $$Z_{Sq} = \frac{1}{j\omega C_{Sq}} + j\omega L_{Sq} + R_{Sq}$$

$C_{Sq}$: capacitance of $q^{th}$ reception resonance circuit
$L_{Sq}$: self-inductance of $q^{th}$ reception resonance circuit
$R_{Sq}$: internal resistance of $q^{th}$ reception resonance circuit.

6. The method of claim 4, wherein the determining the sign of the mutual inductance includes:
determining the sign of the mutual inductance using Equation 2:

in the case of $V_{Rq,in\text{-}phase} > V_{Rq,out\ of\ phase}(+)$ in the case of $V_{Rq,in\text{-}phase} < V_{Rq,out\ of\ phase}(-)$  [Equation 2]

wherein $V_{Rq,in\text{-}phase}$ is a voltage generated in a $q^{th}$ reception resonance circuit when currents having predetermined equal magnitude and in-phase are supplied to the reference transmission resonance circuit and the transmission resonance circuit for determining the sign of the mutual inductance, and $V_{Rq,out\ of\ phase}$ is a voltage generated in a $q^{th}$ reception resonance circuit when currents having predetermined equal magnitude and out of phase are supplied to the reference transmission resonance circuit and the transmission resonance circuit for determining the sign of the mutual inductance.

* * * * *